Figure 1:
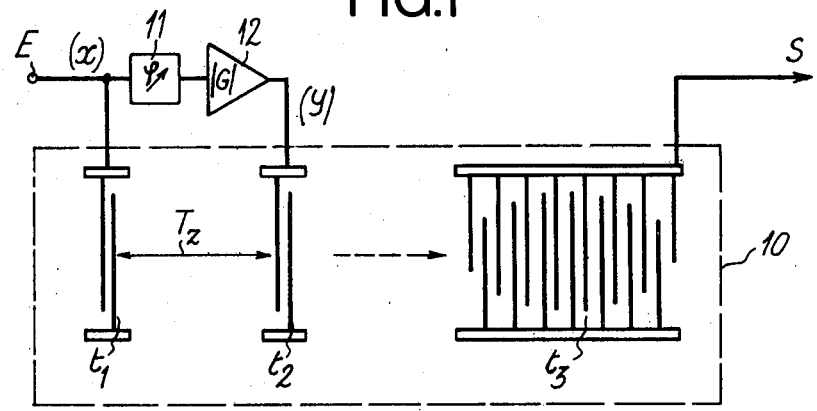

United States Patent [19]

Feldmann et al.

[11] 4,398,163

[45] Aug. 9, 1983

[54] ELASTIC SURFACE WAVE RECURSIVE FILTER

[75] Inventors: Michel Feldmann, Paris; Jeannine Hénaff, Clamart; André Gabry, Le Plessis Robinson, of France

[73] Assignee: L'Etat Francais, Issy les Moulineaux, France

[21] Appl. No.: 263,268

[22] Filed: May 13, 1981

[30] Foreign Application Priority Data

Jun. 10, 1980 [FR] France .................................. 80 12867
Oct. 13, 1980 [FR] France .................................. 80 21827

[51] Int. Cl.$^3$ ........................ H03H 9/25; H03H 9/64; H03B 5/32
[52] U.S. Cl. ................................ 333/193; 331/107 A; 331/DIG. 2; 333/195; 333/196
[58] Field of Search .............................. 333/150–155, 333/193–196; 331/DIG. 2, 107 A; 310/313 R, 313 A, 313 B, 313 C, 313 D; 330/5.5

[56] References Cited

U.S. PATENT DOCUMENTS 3,845,418  1/1974  Weglein .............................. 333/151

FOREIGN PATENT DOCUMENTS 1521478  8/1978  United Kingdom ........... 331/107 A

OTHER PUBLICATIONS

Field et al.–"Surface Acoustic Wave Regenerative Active Resonator", 1977 Ultrasonics Symposium Proceedings, IEEE Cat. #77CH1264-1SU; pp. 909–912.
Field et al.–"Bistable Surface Acoustic Wave Resonators" 1978 Ultrasonic Symposium Proceedings, The Cherry Hill Hyatt House, New Jersey, 25–27 Sep. 1978; pp. 469–173.

*Primary Examiner*—Marvin L. Nussbaum
*Attorney, Agent, or Firm*—Oblon, Fisher, Spivak, McClelland & Maier

[57] ABSTRACT

An elastic surface wave recursive filter comprising: at least one delay line formed by two elastic surface wave transducers, such line being looped on itself externally by an amplifier, a means for introducing an elastic surface wave into such line, such means being connected to an input of the filter, and a third transducer having the form of a transversal filter, the transducer being coupled to said line and connected to an output of the filter. The transfer function of the filter is the form $P(z)/Q(z)$, the numerator and the denominator being independant.

8 Claims, 10 Drawing Figures

ELASTIC SURFACE WAVE RECURSIVE FILTER

The invention relates to an elastic surface wave recursive filter. The invention applies to electronics, more particularly the making of telecommunication equipment, inter alia communications with moving entities.

Elastic surface wave filters can be divided into two categories:
- transversal filters, which are formed by a given impulse response transducer followed by a reading transducer,
- resonator filters, which are formed by elastic surface wave resonators coupled to one another, the resonators being obtained, for example, by means of engraved grooves.

Such devices are disclosed inter alia in the work of H. MATTHEWS (Editor) entitled "Surface Wave Filters", John Wiley (1977) and in the work of A. A. OLINER (Editor) entitled "Acoustic Surface Waves", included in the Collection "Topics in Applied Physics", vol. 24, Springer Verlag (1978).

The filters of the first category have a transfer function of the form $P(z)$ where z is a complex variable equal to $jwt$, w being a pulsation and t being time. This function has no poles, and the associated filters are non-recursive. The filters of the second category have a transfer function of the form $P(z)/Q(z)$, the presence of the denominator $Q(z)$ involving the existence of poles. These filters are recursive.

The invention relates to recursive filters-i.e., filters whose transfer function is of the form $P(z)/Q(z)$.

The prior art recursive filters have this disadvantage that the numerator and the denominator of their transfer function are tied, resulting in difficulties when a particular response must be synthesized.

The invention which aims at obviating this disadvantage, proposes a filter which leads to the independence of the numerator and denominator of the corresponding transfer function, thus leaving a greater latitude in the selection of the components of the filter and if necessary allowing electronic tuning.

To this end the filter according to the invention is characterized in that it comprises: at least one delay line formed by two elastic surface wave transducers, such line being looped on itself externally by an amplifier, a means for introducing an elastic surface wave into such line, such means being connected to an input of the filter, and a third transducer having the form of a transversal filter, the transducer being coupled to said line and connected to an output of the filter.

In an advantageous variant, the amplifier is preceded by an auxiliary dephaser which can be controlled electronically. Such dephasers are known and comprise, for example, a hybrid junction and electronically controllable capacities.

Figure 2A:
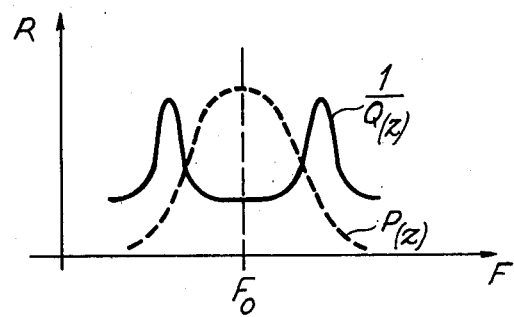
Figure 2B:
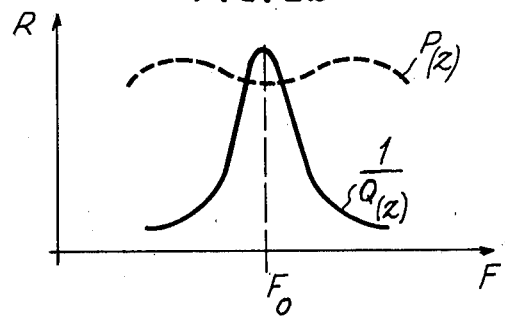
Figure 3:
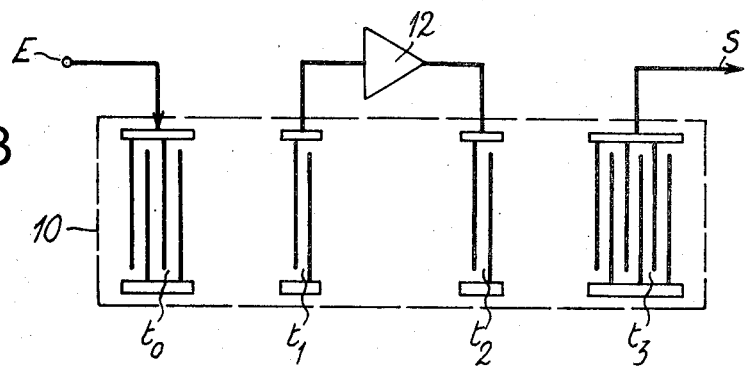
Figure 4:
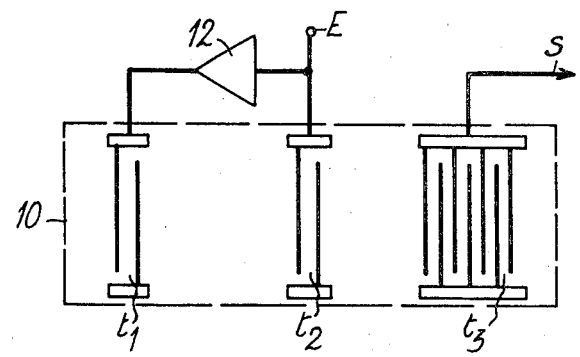
Figure 5:
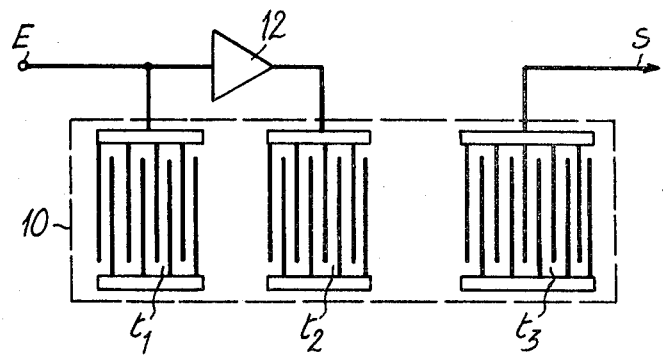
Figure 6:
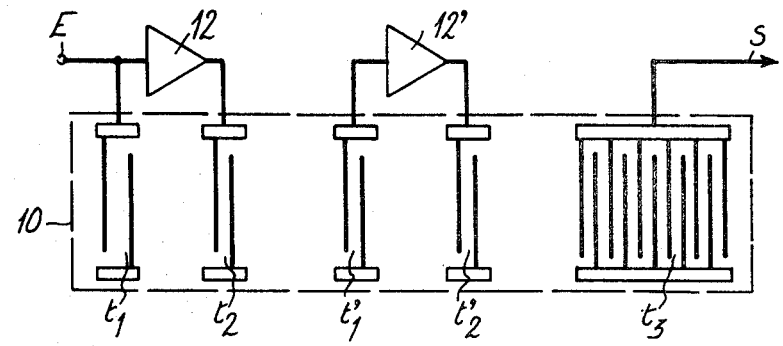
Figure 7:
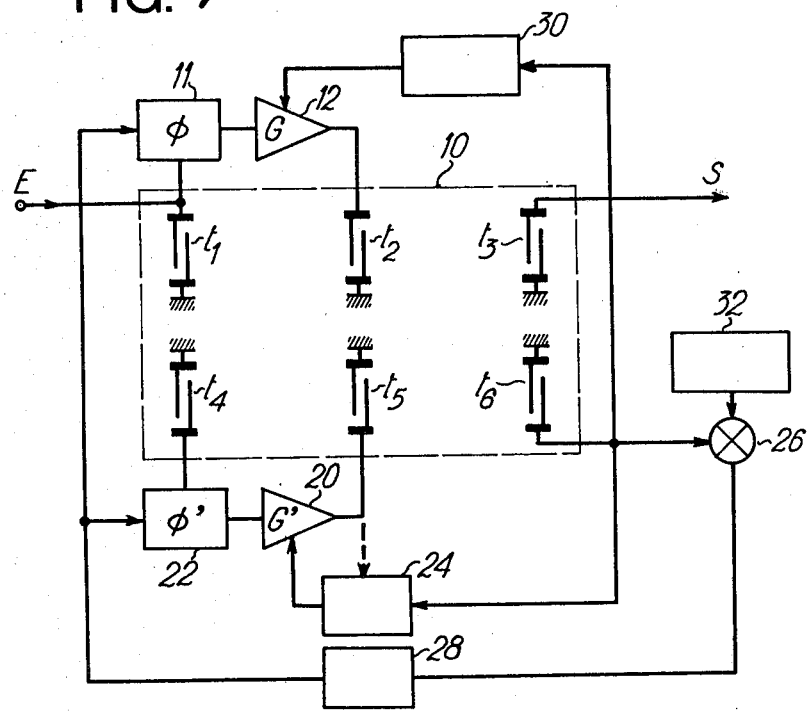
Figure 8:
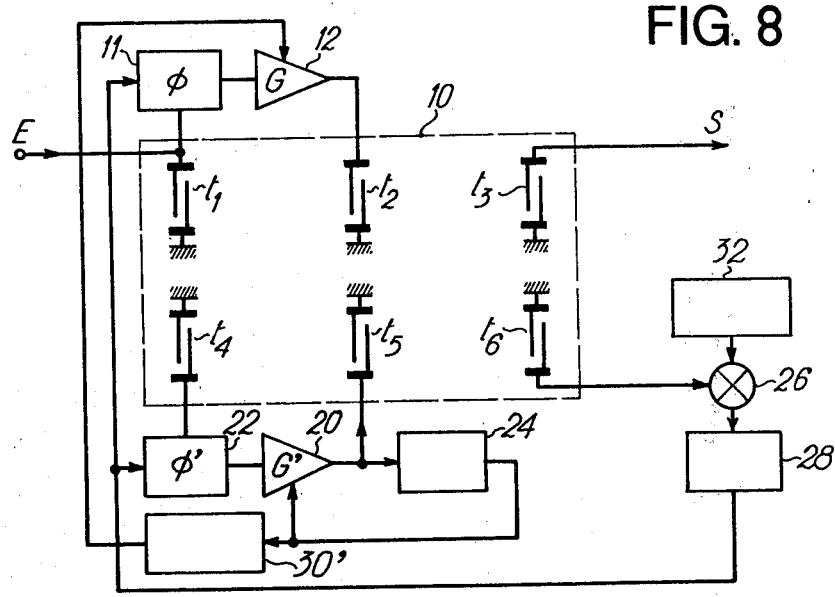
Figure 9:
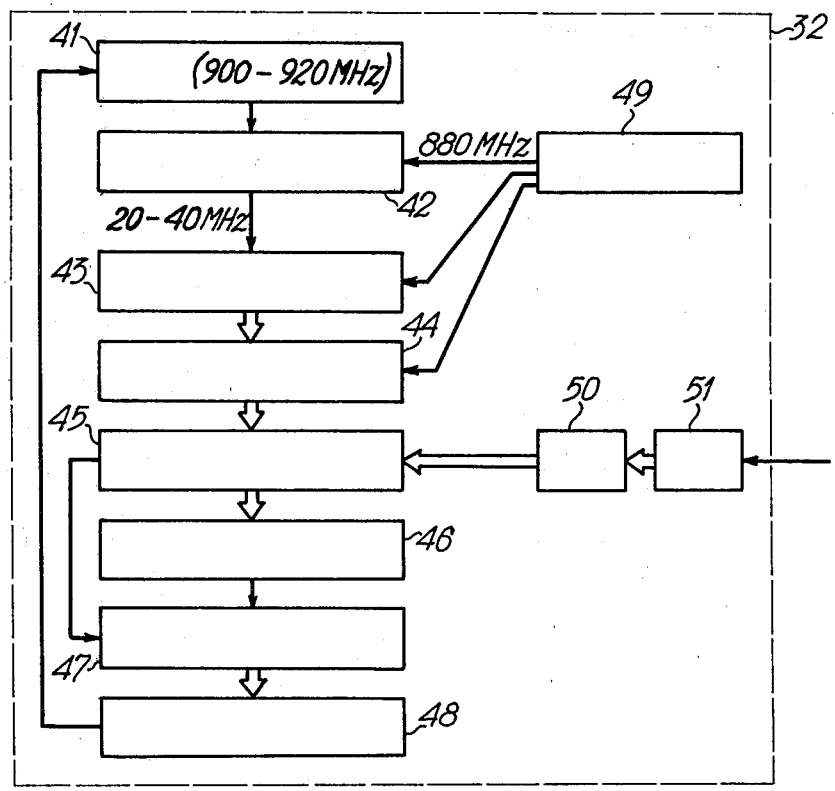

In any case, the features and advantages of the invention will be gathered more clearly from the following description of non-limitative exemplary embodiments with reference to drawings wherein:

FIG. 1 shows a first embodiment of a filter according to the invention comprising an auxiliary dephaser, FIGS. 2a and 2b show two examples of frequency response of the elements making up the filter according to the invention, FIG. 3 shows a second embodiment of a filter according to the invention, FIG. 4 shows a third embodiment of a filter according to the invention, FIG. 5 shows a fourth embodiment of a filter according to the invention, FIG. 6 shows a fifth embodiment of a filter according to the invention, FIG. 7 is a diagram of a filter associated with a reference oscillator in a first variant, FIG. 8 is a diagram of a filter associated with a reference oscillator in a second variant, and FIG. 9 illustrates an example of a device for synchronizing the surface wave oscillator with numerical data determining particular frequencies.

Referring to FIG. 1, a filter comprises, on a substrate 10 adapted to propagate elastic surface waves (for example, lithium niobate), a first transducer $t_1$ connected to a signal input E and a second transducer $t_2$, the two transducers being coupled to one another and defining a transfer function $T(z)$ delay line. The two transducers $t_1$ and $t_2$ are connected to one another via an amplifier 12. The filter also comprises a third transducer $t_3$ in the form of a transversal filter of transfer function $P(z)$, the latter transducer being connected to a signal output S. An auxiliary controllable dephaser 11 is inserted in the external complex gain branch G.

The device operates as follows. If x is the input signal applied to the transducer $t_1$ and y is the signal applied to the transducer $t_2$, we have:

$$y = Gx + T(z)y$$

that is:

$$y = \frac{G}{1 - GT(z)} x$$

and also:

$$y = \frac{1}{Q(z)} x$$

The transducer $t_2$ radiates an elastic surface wave towards the third transducer $t_3$, such wave being proportional to y-i.e., $1/Q(z)x$. We therefore find at the output S a signal of the form:

$$\frac{1}{Q(z)} x P(z)$$

The global transfer function of the filter between the input E and the output S is therefore of the form:

$$\frac{N(z)}{D(z)}$$

where the denominator $D(z)$ is defined only by the looped delay line.

The function $1/Q(z)$ is not in fact just any function, since the device which determines the function is a delay line whose function is to delay the input signal by n basic periods. We therefore have:

$$T(z) = z^{-n}$$

or else, taking $G = r^n = R^n e^{jn\phi}$ where $n\phi$ is the dephasing produced by the auxiliary dephaser and r is complex and of modulus R:

$$GT(z) = (r/z)^n$$

and obviously:

$$1 - GT(z) = z^{-n}(z^n - r^n)$$

The global transfer function of the filter is therefore finally of the form:

$$\frac{z^n P(z)}{z^n - r^n}$$

in which the denominator is imposed.

When the auxiliary dephasing differs from zero, the denominator can be written:

$$Q = z^n - r^n = (Z^n - R^n)e^{jn\phi}$$

with:

$$Z = ze^{-j\phi} = \exp j r \tau(\omega - \phi/)$$

where $\tau$ corresponds to an elementary delay. Since the factor $\exp(jn\phi)$ is without influence, the effect of the dephasing is thus to form an electronically tunable filter. When $\phi = 0$, $Z = z$.

In the absence of auxiliary dephasing, the synthesis of the filter therefore amounts to the calculation of a suitable numerator or else the synthesis of the transversal filter $t_3$. Methods for doing this are known. For example, reference can be made to the articles by:

M. FELDMANN and J. HENAFF, entitled "Design of Saw Filter with minimum Phase Response", published in IEEE Ultrasonics Symposium, Sept. 25-27, 1978, CHERRY HILL (New Jersey) U.S.A., J. HENAFF and M. FELDMANN, entitled "Design and Capabilities of Saw Filters: Synthesis and Technologies", published in the 1979 Papers of the IEEE International Symposium on Circuits and Systems, ISCAS 79, TOKYO, Japan, 17-19 July 1979, M. FELDMANN, entitled "Direct Synthesis of Minimum Phase Transversal Filters", published in the same Papers of the IEEE International.

FIG. 2 shows two examples of frequency (F) response (R) which can be used for forming a filter according to the invention. The function $1/Q(z)$ is shown by a solid line, the function $P(z)$ being shown by a chain line. In FIG. (a) the function $1/Q(z)$ has two "bosses", having only one boss in FIG. (b).

By way of example, a simple example can be given of determining a filter according to the invention. Let us suppose we have to make a recursive filter defined by the function:

$$\frac{P(z)}{Q(z)} = \frac{z^2 - 2z\cos\theta + 1}{z^2 + rz + r^2} \text{ (where } r < 1\text{)}$$

This function corresponds to an elliptical filter of the second order.

The transfer function corresponding to a delay of duration $\tau = 2\pi/w_O$, where $w_O$ is the central frequency of the system is also denoted by $z^{-1}$.

Then a line is formed with a delay of 3, whose transfer function is:

$$T(z) = z^{-3}$$

we have:

$$GT = r^3 z^{-3}$$

and:

$$1 - GT = z^{-3}(z^3 - r^3) = z^{-3}(z - r)(z^2 + rz + r^2)$$

It is then enough to take P(z) proportional to:

$$z^{-3}(z - r)(z^2 - 2z \cos\theta + 1),$$

i.e.:

$$P(z) = 1 - z^{-1}(r + 2\cos\theta) + z^{-2}(1 + 2R\cos\theta) - rz.$$

The transducer $t_3$ therefore permits as coefficient:

1, $(r + 2\cos\theta)$, $(1 + 2r\cos\theta)$, $r$.

Of course, the embodiment illustrated in FIG. 1 is given merely by way of explanation, and other modes might be imagined which come within the scope of the invention. Some of them are illustrated in FIGS. 3-6.

The filter illustrated in FIG. 3 is distinguished from the one illustrated in FIG. 1 by the fact that the extra transducer $t_0$ which receives the signal to be filtered is disposed outside the resonator formed by $t_1$ and $t_2$.

The filter illustrated in FIG. 4 is similar to that illustrated in FIG. 3, but the transducers of the resonator are of the interdigited comb type.

Finally, the filter illustrated in FIG. 5 comprises a plurality of resonators formed by transducers $(t_1, t_2)$, $(t_1', t_2')$, etc ..., an input transducer $t_0$ and an output transducer $t_3$.

Other variants might also be imagined on the basis of these Examples.

In the particular variant in which the amplifier is preceded by an auxiliary dephaser, the input signal x is introduced into the loop formed by the delay line (of duration T), the amplifier 12 (of gain G) and the dephaser 11 (by an angle $\phi$). The control of the angle $\phi$ fixes the central operating frequency $\omega/2\pi$ in accordance with the formula:

$$\phi + \omega T = 2k\pi$$

where k is an integer. Around this frequency the excess voltage Q can be evaluated as:

$$Q = \frac{\omega T/2}{1 - p}$$

where $p = G/A$ is the gain corresponding to one complete revolution, A being the attenuation in the loop.

Such a filter will be stable and tuned to the frequency $\omega/2\pi$, only if the angle $T + \phi$ and the gain p are themselves stable. If on the contrary p reaches or exceeds unity, the filter will operate as an oscillator at the frequency $\omega$.

Another object of the invention is to obviate this disadvantage by completing the device by an automatic gain control means.

Similarly, if the phase $\phi + \omega T$ drifts, the central frequency of the filter will drift in the same manner. Another object of the invention is to obviate this disadvantage by completing the device by an automatic phase control means.

According to the invention these two extra control means for the gain and phase respectively are obtained from an oscillator formed, like the filter itself, by an elastic surface wave delay line looped on itself and deposited on the same substrate as that of the filter, so as to be in the same temperature and environment conditions as the latter.

The oscillator is associated with an automatic unit value gain control and an automatic phase control loop which operates from a reference signal. The oscillator then serves as a reference to control the gain and phase of the amplifier and the filter dephaser.

Embodiments will now be described with reference to FIGS. 7-9.

The device illustrated in FIG. 7 comprises the elements already illustrated in FIG. 1—i.e., a filter formed by transducers $t_1$-$t_3$ deposited on a substrate 10, a dephaser 11 introducing a dephasing $\phi$ and an amplifier 12 of gain G.

In the variant described, the device comprises a second delay line formed by two elastic surface wave transducers $t_4$, $t_5$ and a transducer $t_6$ in the form of a transversal filter. The transducers are deposited on the same substrate 10 as the transducers $t_1$-$t_3$ of the actual filter. The second delay line is looped on itself externally by a controllable gain amplifier 20 and a controllable dephaser 22. The amplifier 20 is controlled by a circuit with an input connected to one of the transducers $t_5$ or $t_6$, the gain of the amplifier 20 being controlled to a value just equal to unity. The controllable dephaser 22 is controlled by a circuit 28 with an input connected to a phase comparator 26 with two inputs, one connected to the transducer $t_6$ and the other receiving a reference signal. The filter also comprises an automatic gain control circuit 30 with an input connected to the transducer $t_6$ and an output connected to the amplifier 12, the circuit being so controlled that the gain of the amplifier is lower than that of the amplifier 20. The dephaser 11 is also controlled by the phase control circuit 28.

The device operates as follows. The circuit 24 is controlled to ensure that the amplifier 20 has a unit gain, without saturation. For this purpose it is enough, for example, to keep the harmonic 2 at the output of the amplifier at a very low level. The circuit 30 reproduces the same gain control but offset by a constant value, so that the amplifier 12 has a gain which is constant and less than unity and which corresponds to the excess voltage required for the filter.

The signal extracted from the transducer $t_6$ is compared in frequency in the comparator 26 with a reference signal delivered, for example, by a synthesizer 32. The loop formed by the comparator 26, the circuit 28 and the dephaser 22 enables the phase of the signal emitted by the oscillator to be brought to that of the signal of the synthesizer, so that the frequency of the former is adjusted to that of the latter. Since the circuit 28 also controls the dephaser 11, such control also acts on the central frequency of the filter.

The device illustrated in FIG. 8 differs from that illustrated in FIG. 7 by the feature that the gain control circuit 24 has its input connected to the transducer $t_5$, and no longer to the transducer $t_6$, and the gain control circuit of the amplifier 12 is formed by a circuit 30' which displaces downwards the control signal delivered by the circuit 24.

When the filter just described is used on board a vehicle, the synthesizer 32 can be controlled by a stabilized radio wave, such as that permanently emitted by the Allouis transmitter and stable at about $10^{-12}$. This wave enables the local oscillator to be readjusted over a long period of time (to suppress the Doppler effect and propagation fading).

The means forming the automatic gain and dephasing control loops can be of any known type. The phase control can inter alia be effected by numerical means. In that case the oscillator tunable to surface waves and the fixed local oscillator included in the synthesizer (which can also be a surface wave synthesizer) produce by beats a low frequency whose alternations are counted numerically. The numerical difference between this count and a nominal value displayed is converted by a digital-analog convertor into an error signal applied on return to the control dephaser 22 of the surface wave oscillator.

FIG. 9 illustrates an example of a device enabling an oscillator to be adapted to surface waves on numerical data determining particular frequencies. A device of this kind corresponds to circuit 32 in schemes 2 and 3.

The device illustrated comprises a surface wave oscillator 41 tunable from 900 to 920 MHz, a beat modulator and filter 42, a BCD-type counter 43, a numerical store 44, a calculator 45, a pulse concentrator 46, a counter-discounter 47 with memory, a digital-analog convertor 48, a quartz oscillator block and time base 49, a numerical store 50 and a data collecting circuit 51.

The device operates as follows. The surface wave oscillator 41 can be tuned every 20 kHz between 900 and 920 MHz by means of a voltage. The tuning level therefore comprises 1,000 channels. The beat modulator and filter 42 reduces the frequency of the 900 MHz band to a band extending from 20 to 40 MHz by subtraction with the signal at 880 MHz produced by the oscillator 49 from a quartz oscillator of fluctuation close to $10^{-7}$ (temperature-compensated quartz). The same quartz oscillator controls time base circuits to control different functions of the device (counter 43, store 4). The counter 43 receives the frequency of 20 to 40 MHz and measures it in 5 ms. The measuring time is followed by an interval of 5 ms of rest.

The number which is obtained is made up of the following digits:

M originating from the measurement of 2 to 4 of the tens of MHz; this digit is normally 1; it must not drop to zero or rise to 2 (the extreme channel at 920 MHz being excluded);

C, D and U determine the rank of the channel adopted in the total band. This number therefore extends from 000 to 999 from unit to unit and corresponds to frequencies of the oscillator 41 separated by intervals of 20 kHz, assuming that the synchronization is closed.

This store 44 receives the result delivered by the counter 43. The circuit 51 receives data originating from an emitter which selects numerically one of the frequency channels; it decodes the data and stores them provisionally in an internal store which is then transferred to the store 50. This store comprises permanent data in addition to reception data C', D', U'. The complete number stored is of the form 1C'D'U'00. The calculator 45 determines the difference in size and sign between the two numbers which it receives from the stores 44 and 50.

The object of pulse concentrator 46 is to supply to the counter-discounter 47 the necessary number of pulses with the appropriate sign, so that once its register has been analogically decoded, it is capable of synchronizing the frequency of the oscillator 41 on the channel selected. This can be a multiplexer assembly which, supplied with progressive recurrence pulses (in accordance with the BCD code, for example), runs over the various digits of the difference which are given by the calculator and gives to the output the pulse density corresponding to the cancellation of the adjustment error. For 1 digit of deviation, the frequency of repetition of the pulses is such that a single pulse leaves the multiplexer to be directed to the counter-discounter 47.

The register of the counter-discounter 47 is filled or emptied in accordance with the sign of the difference supplied by the calculator. This variation must correspond exactly to the required synchronization voltage variation. The contents of the counter are duly written into a permanent store which serves as the basis for digital-analog conversion.

The convertor 48 delivers a continuous voltage which can be adjusted to correspond as exactly as possible to the oscillator control voltage.

We claim:

1. An elastic surface wave recursive filter, comprising:
   a substrate;
   a first delay line, including first and second surface wave transducers; disposed on said substrate;
   a first amplifier means, connected across said first delay line and positioned externally of said substrate, for amplifying a signal from said first transducer;
   a means, connected to an input of the filter, for introducing an elastic surface wave into said first delay line;
   a first transversal filter, disposed on said substrate in spaced relation from said first delay line, coupled to said first delay line and connected to an output of the filter.

2. A filter according to claim 1, further comprising:
   a first dephaser connected to said first amplifier, for introducing a constant phase shift of the signal from said first transducer.

3. A filter according to claim 1 wherein said means for introducing the elastic surface wave into said first delay line is formed by one of said first and second transducers.

4. A filter according to claim 1, wherein said means for introducing the elastic surface wave into said first delay line is formed by an extra transducer.

5. A filter according to claim 1 wherein said first and second transducers of said first delay line are of the interdigited comb type.

6. An elastic surface wave recursive filter, according to claim 2, further comprising:
   a second delay line, including third and fourth elastic surface wave transducers, disposed on said substrate;
   a second amplifier, connected across said second delay line and positioned externally of said substrate, and including a controllable dephaser;
   a second transversal filter, disposed on said substrate,
   a first circuit, connected to said second amplifier and having an input connected to one of said fourth transducer and said second transversal filter, for controlling the gain of said second amplifier to a correct value equal to unity;
   a phase comparator, having a first input connected to said second transversal filter and a second input for receiving a reference signal;
   a second circuit, connected to said controllable dephaser, said first dephaser and having an input connected to said phase comparator, for controlling said controllable dephaser and said first dephaser;
   a third circuit, having an input connected to said second transversal filter and an output connected to said first amplifier, for automatic gain control whereby the gain of said first amplifier is lower than that of the second amplifier.

7. An elastic surface wave recursive filter, according to claim 6, further comprising:
   a frequency synthesizer, connected to said second input of said phase comparator, for generating said reference signal.

8. An elastic surface wave recursive filter, according to claim 7, wherein said frequency synthesizer, comprises:
   a radio-transmitted data receiver;
   an oscillator, connected to said receiver, having a plurality of frequency channels;
   said data from said radio-transmitted data receiver serving to select a frequency channel of said oscillator;
   a calculator, connected to said receiver and said oscillator, for determining the interval between the frequency delivered by said oscillator and the frequency defined by said data receiver;
   a control loop, connected to said oscillator and said calculator to make the interval zero.

* * * * *